(12) United States Patent
Watanabe et al.

(10) Patent No.: US 6,794,682 B2
(45) Date of Patent: Sep. 21, 2004

(54) SEMICONDUCTOR DEVICE, METHOD FOR MANUFACTURING THE SAME, AND RADIATION DETECTOR

(75) Inventors: Minoru Watanabe, Kanagawa (JP); Chiori Mochizuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/108,484

(22) Filed: Mar. 29, 2002

(65) Prior Publication Data

US 2002/0146871 A1 Oct. 10, 2002

(30) Foreign Application Priority Data

Apr. 4, 2001 (JP) ........................................ 2001-106032

(51) Int. Cl.$^7$ .......................... H01L 29/04; H01L 31/20
(52) U.S. Cl. .............................. 257/72; 257/59; 257/61; 257/258; 257/291
(58) Field of Search .............................. 257/59, 61, 72, 257/258, 291, E29.294, 347, 444, 442, 446; 438/200, 164; 250/208.1

(56) References Cited

U.S. PATENT DOCUMENTS 5,315,102 * 5/1994 Abe et al. ................. 250/208.1
6,121,620 * 9/2000 Tashiro et al. ......... 250/370.11

FOREIGN PATENT DOCUMENTS

JP 08-204205 * 8/1996

* cited by examiner

*Primary Examiner*—Minhloan Tran
*Assistant Examiner*—Tan Tran
(74) *Attorney, Agent, or Firm*—Fitzpatrick, Cella, Harper & Scinto

(57) ABSTRACT

In a semiconductor device including bottom-gate-type thin-film transistors, each of which includes a gate electrode provided on an insulating surface of a substrate, a semiconductor layer provided on the gate electrode via a gate insulating layer, a pair of doped semiconductor layers adjacent to the semiconductor layer, and source and drain electrodes consisting of a pair of conductors adjacent to corresponding ones of the pair of doped semiconductor layers, the thickness of portions of the semiconductor layer below the source and drain electrodes is smaller than the thickness of a portion of the semiconductor layer at a gap portion between the source and drain electrodes.

22 Claims, 7 Drawing Sheets

SEMICONDUCTOR DEVICE, METHOD FOR MANUFACTURING THE SAME, AND RADIATION DETECTOR

BACKGROUND OF THE INVENTION

1. Field of the Invention

The present invention relates to a semiconductor device including a thin-film transistor used as a switching element, a method for manufacturing the same, and a radiation detector. More particularly, the invention relates to a semiconductor device for photoelectric conversion having pixels, each including a photoelectric transducer and a thin-film transistor, a method for manufacturing the same, and a radiation detector.

2. Description of the Related Art

Recently, modules using thin-film transistors are being used in various fields. Such modules include, for example, liquid-crystal display devices or organic EL (electroluminescent) displays, each using thin-film transistors as switching elements on an insulating surface of a substrate, large flat-panel sensors, each using thin-film transistors as switching elements on an insulating surface of a substrate, and the like. A large flat-panel sensor is used as a detector for radiation, such as X-rays, by forming a layer of a substance called a scintillator or a phosphor above the sensor.

Although the size of the substrate is increasing, intension to realize a small-size and high-precision semiconductor-device module using thin-film transistors is very strong, since such a module is used as a display device for a portable terminal, a cellular phone or the like. In such circumstances, in order to improve the performance of a thin-film transistor, it is desired to improve the transfer efficiency of the thin-film transistor and also improve the numerical aperture of the corresponding pixel by reducing the size of the thin-film transistor. The situation is the same for a flat-panel sensor, in which it is also necessary to maintain the sensitivity of the sensor while achieving high-speed driving.

At present, bottom-gate-type thin-film transistors in each of which a gate electrode is formed on an insulating substrate and a semiconductor layer is formed on the gate electrode is mostly used as thin-film transistors. The bottom-gate-type thin-film transistors are grossly classified into two types.

One type comprises thin-film transistors called a gap-etching type or a channel-etching type, as shown in FIG. 9. In this type, after forming a gate electrode 2 on an insulating substrate 1, an insulating film 3, a semiconductor layer 4 and a doped semiconductor layer 5 are consecutively formed by CVD (chemical vapor deposition), and a thin-film transistor is formed by etching the doped semiconductor layer 5 at a gap portion of the thin-film transistor. In this gap-etching-type thin-film transistor, since the semiconductor layer 4 is formed thin, it is necessary to improve the distribution of etching at gap etching and make the thickness of the semiconductor layer 4 uniform during film formation.

Another type comprises thin-film transistors called, for example, a etching-stopper type or a channel-passivation type, as shown in FIG. 10. In this type, after forming a gate electrode 2 on an insulating substrate 1, an insulating film 3, a semiconductor layer 4, and a channel-protection film 8 comprising, for example, an insulating film, are consecutively formed by CVD. Then, the channel-protection film 8 is etched except for a portion corresponding to a gap portion of the thin-film transistor, followed by formation of a doped semiconductor layer 5. Then, a thin-film transistor is formed by etching the doped semiconductor layer 5 at a gap portion of the thin-film transistor. In this etching-stopper-type thin-film transistor, although a semiconductor layer can be formed independent of the distribution of etching during gap etching, control when etching the insulating film 8 is important. A high-speed thin-film transistor is provided by stabilizing the etching rate, improvement of the distribution of etching, and the like.

In the etching-stopper-type thin-film transistor using an insulating film comprising, for example, a silicon-nitride film or the like, it is pointed out that, although it is possible to provide a high-performance thin-film transistor by forming a thin semiconductor layer, the number of processes increases, resulting in a large process time.

In the gap-etching-type thin-film transistor, it is pointed out that, although the manufacturing process is relatively simple, it is difficult to form a thin semiconductor film because a dopant is unintentionally injected to a predetermined depth from the surface of the semiconductor layer while the doped semiconductor layer is formed. If the thickness of the semiconductor layer is large, the operation of the thin-film transistor is slow.

It is considered that in any type of thin-film transistor, it is difficult to sufficiently improve the quality of a semiconductor film, serving as a channel, if the thickness of the semiconductor film is very thin, in consideration of the manufacturing process.

In any case, a thin-film transistor capable of performing a high-speed operation using a good-quality thin film as a semiconductor layer, serving as a channel, is being desired.

SUMMARY OF THE INVENTION

It is an object of the present invention to provide a semiconductor device having thin-film transistors capable of performing a high-speed operation, a method for manufacturing the same, and a radiation detector using the semiconductor device.

It is another object of the present invention to provide a semiconductor device having thin-film transistors having excellent transfer efficiency, a method for manufacturing the same, and a radiation detector using the semiconductor device.

It is still another object of the present invention to provide a semiconductor device having inexpensive thin-film transistors which can prevent a decrease in the sensitivity of photoelectric transducers when integrating the thin-film transistors with the photoelectric transducers, a method for manufacturing the same, and a radiation detector using the semiconductor device.

According to one aspect of the present invention, in a semiconductor device including bottom-gate-type thin-film transistors each of which includes a gate electrode provided on an insulating surface of a substrate, a semiconductor layer provided on the gate electrode via a gate insulating layer, a pair of doped semiconductor layers adjacent to the semiconductor layer, and source and drain electrodes consisting of a pair of conductors adjacent to corresponding ones of the pair of doped semiconductor layers, a thickness of portions of the semiconductor layer below the source and drain electrodes is smaller than a thickness of a portion of the semiconductor layer at a gap portion between the source and drain electrodes.

In this invention, the thickness of the portions of the semiconductor layer below the source and drain electrodes may be within a range of 30 nm–300 nm, and the thickness of the portion of the semiconductor layer at the gap portion may be within a range of 60 nm–1,500 nm.

The thickness of the portions of the semiconductor layer below the source and drain electrodes may be 0 nm.

The surface of the gap portion may be covered with a protective film covering the source and drain electrodes. The surface of the gap portion may be covered with a channel-protection film, and end portions of the channel-protection film may be covered with the source and drain electrodes.

The doped semiconductor layer may be formed on the semiconductor layer which has been thinned by etching.

In this invention, photoelectric transducers may also be provided on the insulating surface of the substrate.

Each of the photoelectric transducers may include a semiconductor layer made of a material which is the same as a material for the semiconductor layer at the gap portion of the thin-film transistor and whose thickness is the same as the thickness of the semiconductor layer at the gap portion. Each of the photoelectric transducers may include a semiconductor layer made of a material which is the same as a material for the semiconductor layer at the gap portion of the thin-film transistor and whose thickness of the same as the thickness of the semiconductor layer at the gap portion, a doped semiconductor layer made of a material which is the same as a material for the doped semiconductor layer of the thin-film transistor and whose thickness is the same as a thickness of the doped semiconductor layer of the thin-film transistor, and an insulating layer made of a material which is the same as a material for the gate insulating layer of the thin-film transistor and whose thickness is the same as a thickness of the gate insulating layer.

According to another aspect of the present invention, a method for manufacturing a semiconductor device including bottom-gate-type thin-film transistors each of which includes a gate electrode provided on an insulating surface of a substrate, a semiconductor layer provided on the gate electrode via a gate insulating layer, a pair of doped semiconductor layers adjacent to the semiconductor layer, and source and drain electrodes consisting of a pair of conductors adjacent to corresponding ones of the pair of doped semiconductor layers includes the steps of forming the semiconductor layer, removing surfaces of portions of the semiconductor layer where the source and drain electrodes are to be formed, in a state in which a surface of a portion of the semiconductor layer which is to become a gap portion between the source and drain electrodes is covered with an etching mask, forming the doped semiconductor layer on the portions removed by the etching, and forming the source and drain electrodes on the doped semiconductor layers.

It is preferable that before removing the etching mask after the removing step and thereafter forming the doped semiconductor layers, at least one surface treatment selected from surface treatment by a solution containing ammonia or hydrogen chloride, and hydrogen peroxide, surface treatment by a solution containing a chelating agent, and surface treatment utilizing oxygen plasma is performed for the portions removed by the etching.

It is also preferable that before removing the etching mask after the removing step and thereafter forming the doped semiconductor layers, surface treatment for removing an organic substance is performed for the portions removed by the etching, and then surface treatment by a solution containing hydrogen fluoride is performed.

Before removing the etching mask after the removing step and thereafter forming the doped semiconductor layer, surface treatment utilizing hydrogen plasma may be performed in an apparatus for forming the doped semiconductor layer. The above-described treatment is useful for improving ohmic contact of the source and drain electrodes.

In the above-described manufacturing method, it is preferable that discharge electric power of the plasma during the surface treatment utilizing the hydrogen plasma is equal to or less than discharge electric power when forming the semiconductor layer. It is also preferable that discharge electric power during the surface treatment utilizing the hydrogen plasma is equal to or less than discharge electric power when forming the doped semiconductor layers. The above-described treatment is effective for preventing alteration of the doped semiconductor layers.

In the above-described manufacturing method, it is preferable that surfaces of portions of the semiconductor layer where the source and drain electrodes are to be formed are etched in a state in which surfaces of a semiconductor layer of a photoelectric transducer formed on the insulating surface of the substrate and the semiconductor layer of the thin-film transistor with a protective film, the protective film covering the surface of the semiconductor layer of the photoelectric transducer is etched, and the surfaces of the portions of the semiconductor layer where the source and drain electrodes are to be formed are etched deeper.

A radiation detector according to the present invention includes the above-described semiconductor device, and a controller for processing an image signal from the semiconductor device and transmitting the image signal to an external apparatus.

It is preferable that the radiation detector further includes a display device for displaying an image.

It has become clear that the following two items are required for a high-performance thin-film transistor for achieving the above-described objects.

(1) The portions of the semiconductor layer below the source and drain electrodes are made thin.

(2) The portion of the semiconductor layer at the gap portion between the source and drain electrodes is made thick.

For example, in the case of the gap-etching-type thin-film transistor, during etching of the doped semiconductor layer at the gap portion, a damaged layer having a thickness of about 20 nm–100 nm, occasionally about 20 nm–150 nm, is formed even if a surface layer of the semiconductor layer, below the doped semiconductor layer, where a dopant has been injected. As a result, an increase in the off-current supposedly due to a shift of the threshold voltage Vth of the thin-film transistor, or an increase in the on-resistance of the thin-film transistor due to the damaged layer sometimes occurs. Thus, the off-current becomes larger as the thickness of the semiconductor layer is smaller, resulting in difficulty in manufacturing a thin-film transistor having an excellent transfer efficiency.

In the case of the etching-stopper-type thin-film transistor, although the semiconductor layer can be made relatively thin, for example, the characteristics of the semiconductor layer, serving as a channel, are less sufficient as the semiconductor layer is thinner.

In the case of the gap-etching-type thin-film transistor, when the thickness of the portion of the semiconductor layer at the gap portion between the source and drain electrodes is increased, the off-current of the thin-film transistor may increase due to a decrease in the bulk resistance of the semiconductor layer. However, since it is confirmed that the off-current of the thin-film transistor is determined by leakage at interfaces of the etched portion during gap etching, the off-current is not unintentionally increased even if the thickness of the semiconductor layer at the gap portion between the source and drain electrodes is increased.

In the case of the etching-stopper-type thin-film transistor, such leakage current is much suppressed.

When using the thin-film transistor itself as the photoelectric transducer, or when integrating the thin-film transistor with the photoelectric transducer, it is desired to first form a semiconductor film having a thickness such that light can be sufficiently received, from the convenience of the manufacturing process.

In the present invention, a configuration satisfying the above-described item (2) is adopted because of the above-described reasons.

At portions near the source and drain electrodes, by relatively reducing the thickness of the semiconductor layer, it is possible to reduce the resistance of the semiconductor layer near the source and drain electrodes, thereby reducing the on-resistance of the thin-film transistor.

Accordingly, in the present invention, a configuration satisfying the above-described item (1) is adopted.

DETAILED DESCRIPTION OF THE PREFERRED EMBODIMENTS (First Embodiment)

Figure 1:
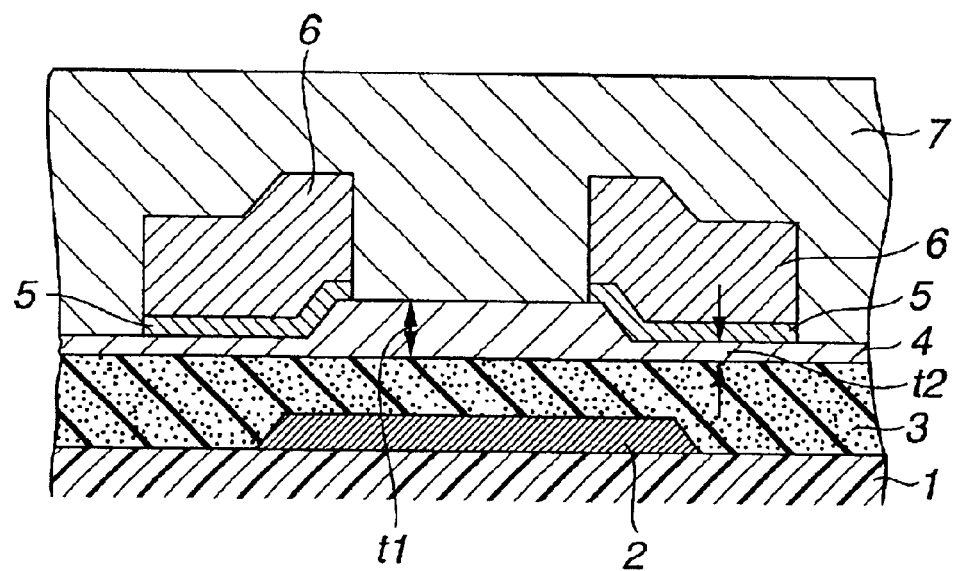
FIG. 1 is a cross-sectional view illustrating the configuration of a thin-film transistor according to a first embodiment of the present invention.

A first embodiment of the present invention will now be described in detail with reference to the drawings. FIG. 1 is a cross-sectional view illustrating the configuration of a thin-film transistor according to the first embodiment. In FIG. 1, reference numeral 1 represents an insulating substrate. A gate electrode 2, an insulating film 3, a semiconductor layer 4, a doped semiconductor layer 5, source and drain electrodes 6, and a protective film 7 are formed on the insulating substrate 1.

The surface of a gap portion of the semiconductor layer 4 is covered by the protective film 7 for covering the source and drain electrodes 6, and is thereby passivated.

In the first embodiment, by increasing the thickness of the semiconductor layer 4 only at the gap portion between a source and a drain, influence of a damaged layer during etching of the gap portion is mitigated, influence of a diffused layer of a dopant from an ohmic-contact layer is removed, and a shift of Vth or an increase in the off-current is prevented. Furthermore, by reducing the thickness of portions of the semiconductor layer 4 below the source and drain electrodes 6 where connection is provided, the source-drain resistance is reduced, and a thin-film transistor having a small on-resistance is realized.

A substrate having an insulating surface on which a thin-film transistor is formed is used as the insulating substrate 1. More specifically, an insulator, such as glass, quartz, alumina or the like, or a substrate obtained by forming an insulating film of silicon oxide or the like on a surface of a semiconductor or a conductor is used as the insulating substrate 1.

The gate electrode 2 is made of a metal, such as Al, Cr, W, Mo, Ti, Ta, Cu, Ni or the like, an alloy of some of the above-described metals, such as AlCr, AlTi, AlPd, AlCu or the like, or a conductive material, such as tin oxide, indium oxide, indium tin oxide, impurity-doped polycrystalline silicon or the like. A material obtained by laminating a plurality of conductive materials may also be used for the gate electrode 2.

Any film operating as a gate insulating film may be used as the insulating film 3. For example, an insulating oxide or an insulating nitride, such as silicon oxide, silicon nitride, silicon oxide nitride, aluminum oxide, tantalum oxide or the like, may be used for the insulating film 3. A film obtained by laminating a plurality of insulating films may also be used as the insulating film 3.

Any semiconductor layer which can provide a channel for causing carriers to flow by the effect of an electric field produced by applying a gate voltage may be used as the semiconductor layer 4. For example, a noncrystalline semiconductor material, such as amorphous silicon, microcrystalline silicon, amorphous silicon containing microcrystals, polysilicon or the like, is preferably used for the semiconductor layer 4. Particularly, amorphous silicon, microcrystalline silicon, or amorphous silicon containing microcrystals is desirable for the semiconductor layer 4.

A semiconductor layer in which a dopant determining the conduction type of the thin-film semiconductor is added is preferably used as the semiconductor doping layer 5. For example, a noncrystalline semiconductor material, such as amorphous silicon, microcrystalline silicon, amorphous silicon containing microcrystals in which a group-III element, such as boron or the like, or a group-V element, such as phosphorous or the like, is added is preferably used for the doped semiconductor layer 5. Particularly, amorphous silicon in which phosphorous is doped, microcrystalline silicon, amorphous silicon containing microcrystals is desirable for the semiconductor doping layer 5.

The source and drain electrodes 6 may be made of a material appropriately selected from the above-described materials for the gate electrode 2.

The protective film 7 which is used if necessary may be made of a material appropriately selected from the above-described materials for the insulating film 3, as well as an organic insulator, such as polyimide resin, epoxy resin or the like.

In the above-described bottom-gate-type thin-film transistor in which the gate electrode 2, the insulating film 3, the semiconductor layer 4, the doped semiconductor layer 5, and the source and drain electrodes 6 are laminated on the insulating substrate 1, the thickness t2 of portions of the semiconductor layer 4 below the source and drain electrodes 6 is made smaller than the thickness t1 of a portion of the semiconductor layer 4 at the gap portion between the source and the drain.

As described above, according to the first embodiment, in the bottom-gate-type thin-film transistor, by making the thickness of the portion of the semiconductor layer 4 at the gap portion between the source and the drain larger, it is possible to secure a depletion layer at the gap portion during an off-time of the thin-film transistor, and as a result, to prevent an increase in the off-current of the thin-film transistor. Furthermore, by making the portions of the semiconductor layer 4 below the source and drain electrodes 6 smaller, it is possible to realize a thin-film transistor having an excellent transfer efficiency.

A method for manufacturing the thin-film transistor will now be described. First, the insulating substrate 1 having an insulating surface, such as a silicon substrate covered with glass or a silicon-oxide film, is prepared.

A film of a conductive material, such as Al, Cr, W, Mo, AlNd, Ti, Ta, AlTi or the like, is formed on the insulating surface of the insulating substrate 1 by sputtering as the gate electrode 2 such that the thickness of the gate electrode 2 in the form of a single layer or a plurality of layers is 70 nm–500 nm. Photolithography is used for patterning the gate electrode 2. More specifically, a photoresist is coated, the coated photoresist is exposed and developed with a pattern for the gate electrode 2, and the film of the conductive material is subjected to wet etching using the developed photoresist as a mask.

Then, a silicon-oxide film or a silicon-nitride film is formed by CVD as the insulating film 3, and a noncrystalline semiconductor layer (i-layer) made of non-doped hydrogenated amorphous silicon or the like is formed on the insulating film 3 as the semiconductor layer 4. The insulating film 3 and the semiconductor layer 4 are consecutively formed in a vacuum. The thickness of the insulating film 3 is 150–400 nm, and the thickness of the semiconductor layer 4 is 100 nm–150 nm. In order to make portions of the i-layer to be below the source and drain electrodes 6 thinner, only the portions of the i-layer to be below the source and drain electrodes 6 is etched. More specifically, a photoresist is coated on the gap portion between the source and the drain, and patterning of the photoresist is performed by an exposure apparatus so that the photoresist is removed from the portions of the i-layer to be below the source and the drain electrodes 6. After the patterning of the photoresist, the portions of the i-layer where the photoresist is not present are etched by a dry-etching apparatus.

Reactive ion etching using an anode-coupling-type plasma etching apparatus, an apparatus for applying a RF (radio frequency) bias voltage to the substrate side, or the like, chemical dry etching using an apparatus for generating active ions of a gas at a portion separated from a reaction chamber, or the like may be used as the etching in the first embodiment. Control is performed so that the thickness of the portions of the semiconductor layer 4 below the source and drain electrodes 6 becomes 30–70 nm after the etching. The thickness of the portion at the gap portion between the source and the drain is 100 nm–150 nm, which is the thickness at the first film formation.

After stripping the photoresist after the etching, an organic film adhering to the surface is removed by processing the surface with a mixed solution of ammonia and an aqueous solution of hydrogen peroxide or a mixed solution of hydrochloric acid and an aqueous solution of hydrogen peroxide. Instead, surface treatment may be performed with a solution containing a chelating agent. It has been confirmed that equivalent effects can be obtained by plasma processing performed in an atmosphere containing oxygen, instead of the above-described processing using chemicals. After the above-described processing, processing using chemicals containing about 1 volume % of hydrofluoric acid and about 99 volume % of water, to remove the oxide film formed on the surface of the i-layer by hydrogen peroxide. At that time, acetic acid may be added to the hydrofluoric acid. Instead, an aqueous solution of hydrogen fluoride and ammonium fluoride may be used.

As the insulating film 3 and the semiconductor layer 4, the doped semiconductor layers 5 are formed by CVD. More specifically, by plasma CVD using a gas obtained by adding hydrogen-diluted phosphine to a silane gas, a doped layer of a noncrystalline semiconductor, such as amorphous silicon or microcrystalline silicon doped with phosphorus, is formed. By performing hydrogen-plasma processing in a film forming chamber with the same pressure and with the same or less electric power as when forming the doped semiconductor layers 5, before the film formation, the surface of the semiconductor layer 4 is hydrogenated, to provide a better contact at the interfaces between the doped semiconductor layers 5 and the semiconductor layer 4.

The thickness of the doped semiconductor layers 5 is 20 nm–70 nm. After forming the doped semiconductor layers 5, the source and drain electrodes 6 made of a conductive material whose resistivity is lower than the resistivity of the doped semiconductor layer 5, and films of a conductive material, serving as wires, are formed. A metal, such as Al, Cr, W, Mo, Ti, Ta, AlTi, SnO, ITO (indium titanium oxide) or the like, a conductive metal oxide, or the like is used as the conductive material. In the first embodiment, an Al film about 1,000 nm thick formed by sputtering may be preferably used.

As the gate electrode 2, patterning of the source and drain electrodes 6 and the wires is performed according to photolithography, and etching is performed according to wet etching. After forming the source and drain electrodes 6 and the wires, etching of the doped semiconductor layers 5 is performed using the same photoresist. Anode-coupling plasma etching or chemical dry etching is suitable as the etching, because damage by plasma at etched portions is small. However, reactive etching may also be used. In a state in which the thin-film transistor has been formed, the protective film 7 is formed by CVD. A silicon nitride film is used as the protective film 7. Although it depends on steps in the pattern of the formed thin-film transistor, the thickness of the protective film 7 is within a range of about 500 nm–2,000 nm.

As described above, in the first embodiment, by making the thickness of the portions of the semiconductor layer 4 below the source and drain electrodes 6 to a smaller value of 30 nm–70 nm, it is possible to reduce a series resistance of the thin-film transistor due to a perpendicular component of the semiconductor layer 4, greatly reduce the on-resistance of the thin-film transistor, and improve the transfer efficiency of the thin-film transistor. At the same time, as for the gap portion between the source and the drain, by making the thickness of the semiconductor layer 4 to a larger value of 100 nm–150 nm, it is possible to secure a depletion layer because the thickness of the semiconductor layer 4 is large, and prevent the off-current because of the secured depletion layer, even if a dopant is injected into the semiconductor layer 4 after forming the doped semiconductor layer 5, because the thickness of the semiconductor layer 4 is relatively large. As a result, it is possible to realize a thin-film transistor having an excellent transfer efficiency and characteristics. It is also possible to prevent an increase on the off-current due to damage of the surface produced at gap etching. Furthermore, in comparison with an etching-stopper-type thin-film transistor using a silicon-nitride film or a silicon-oxide film, it is unnecessary to separately form a film serving as an etching stopper, improvement in the process time can be expected.

(Second Embodiment)

A semiconductor device according to a second embodiment of the present invention will now be described.

Figure 2:
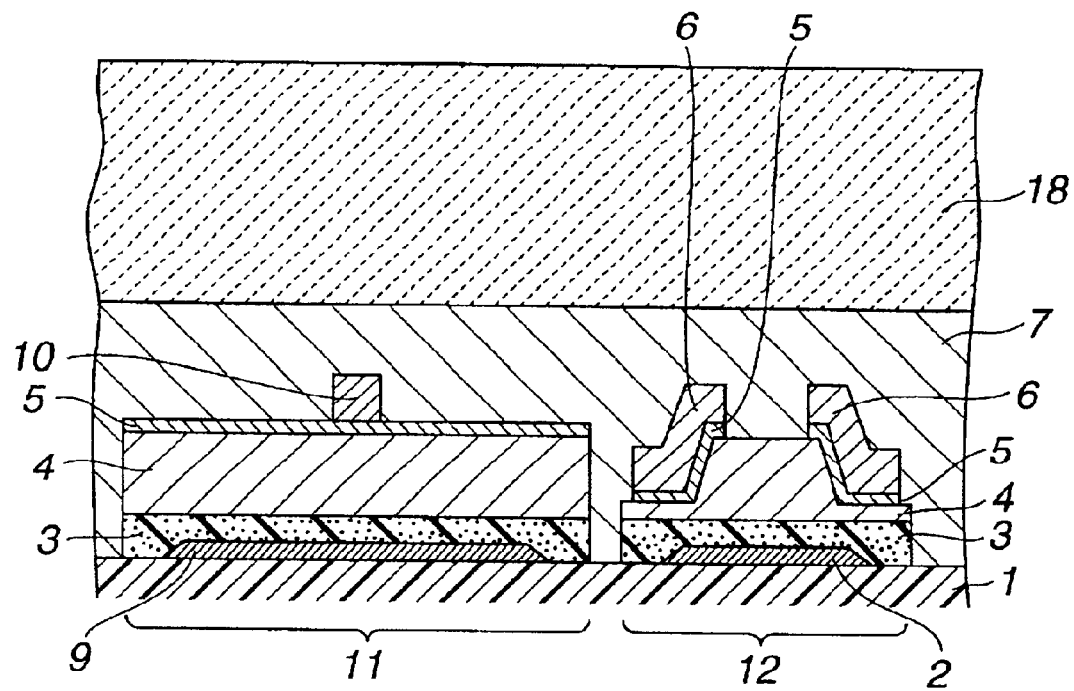
FIG. 2 is a cross-sectional view illustrating the configuration of a photoelectric transducer using the thin-film transistor shown in FIG. 1, according to a second embodiment of the present invention.

FIG. 2 is a cross-sectional view illustrating the configuration of a flat-panel sensor (a photoelectric transducer) using a thin-film transistor whose configuration is the same as the configuration shown in FIG. 1. In FIG. 2, a sensor unit (a photoelectric conversion element) 11 and a thin-film transistor 12 are arranged in parallel on an insulating substrate 1. One pixel is configured at least by this pair. Although the sensor unit 11 may comprise a PIN-type sensor, in FIG. 2, simplification of the manufacturing process is achieved by using an MIS(metal-insulator-semiconductor)-type sensor, which can be formed with the same films as for the thin-film transistor 12, as the sensor unit 11.

As in the case of the thin-film transistor shown in FIG. 1, the thin-film transistor 12 is obtained by forming a gate electrode 2, an insulating film 3, a semiconductor layer 4, a doped semiconductor layer 5, source and drain electrodes 6, and a protective film 7 on the insulating substrate 1. Portions indicated by the same reference numerals as in FIG. 1 are formed with the same materials and the same processes. The semiconductor layer 4 is obtained using a semiconductor film formed according to the same film forming process for both the sensor unit 11 and the thin-film transistor 12. Only portions of the semiconductor layer 4 below the source and drain electrodes 6 are made thinner by etching or the like.

A sensor electrode 9 present at a lower portion of the sensor unit 11 can be formed with the same material and according to the same processing as for the gate electrode 2. An electrode wire 10 present at an upper portion of the sensor unit 11 can be formed with the same material and according to the same process as for the source and drain electrodes 6.

The thickness of a portion of the semiconductor layer 4 at the gap portion of the thin-film transistor 12 and the thickness of the semiconductor layer 4 of the sensor unit 11 are equal, or differ by an amount of over-etching during etching of the doped semiconductor layer 5.

Reference numeral 18 represents a layer provided if necessary. In the second embodiment, the layer 18 is made of a material called a phosphor or a scintillator which receives radiation, such as X-rays, and emit light having a different wavelength, such as visible light.

By using the layer 18, it is possible to utilize the flat-panel sensor as a radiation detector.

Figure 3:
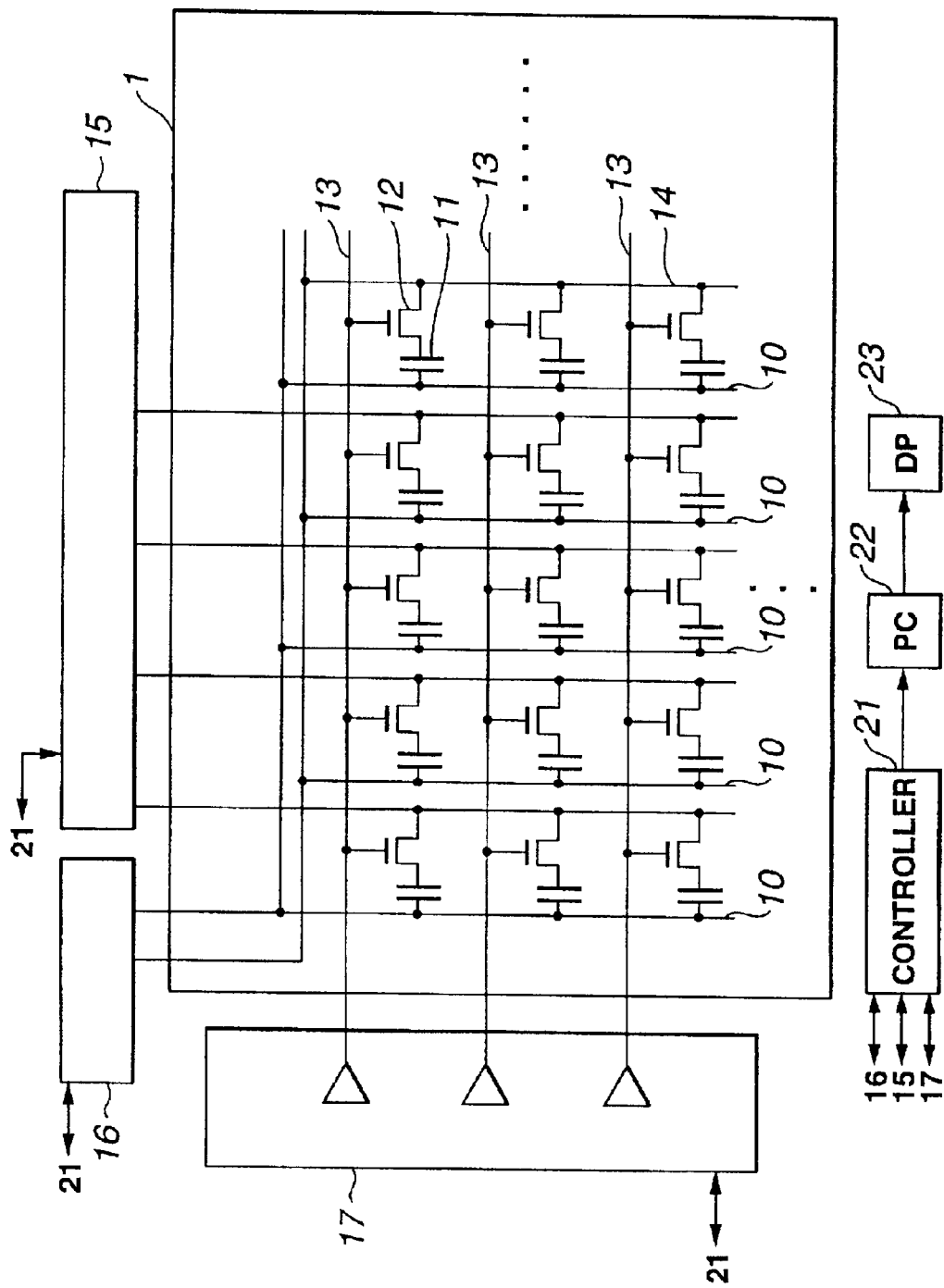
FIG. 3 is a diagram illustrating equivalent circuitry including driving circuits, each for driving the photoelectric transducer shown in FIG. 2.

FIG. 3 is a diagram illustrating a circuitry configuration including flat-panel sensors (photoelectric transducers) as shown in FIG. 2 and driving circuits for driving corresponding ones of the flat-panel sensors. A pair of a sensor unit 11 and a thin-film transistor 12 shown in FIG. 3 corresponds to the pair shown in FIG. 2. In FIG. 3, respective pairs of the sensor unit 11 and the thin-film transistor 12 are two-dimensionally arranged. Emitted light is sensed by the MIS-type sensor unit 11, in which electrons or holes are accumulated. Then, by driving the corresponding thin-film transistor 12 by a gate driver circuit 17, the sensor unit 11 is controlled via a gate line 13, and the accumulated electrons or holes are transferred to a signal processing circuit 15 via a signal line 14. Then, the electrons or holes accumulated in the MIS-type sensor unit 11 are removed via a common-electrode wire 10 by driving of a common-electrode driver circuit unit 16.

A controller 21 controls driving of the signal processing circuit unit 15, the common-electrode driver circuit unit 16 and the gate driver circuit unit 17, processes the obtained image signal, and transmits the resultant signal to an external device. A computer 22 receives data, such as an image signal transmitted from the controller 21, reproduces the image signal, and displays the reproduced image signal on a display device 23.

In the second embodiment, by making the thickness of portions of the semiconductor layer 4 below the source and drain electrodes 6 of the thin-film transistor 12 smaller, it is possible to manufacture a high-performance thin-film transistor having an excellent transfer efficiency and a small off-current. As a result, it is possible to realize a high-sensitivity flat-panel sensor by reducing the size of the thin-film transistor 12 and improving the numerical aperture of the sensor unit 11. Furthermore, by making the thickness of the semiconductor layer 4 of the sensor unit 11 for storing light to be equal to or larger than the thickness of the portion of the thin-film transistor 12 at the gap portion between the source and the drain, it is possible to improve light absorptance and realize a high-sensitivity radiation sensor.

A method for manufacturing the flat-panel sensor will now be described with reference to FIGS. 4A–4E. First, the insulating substrate 1 having an insulating surface, such as a silicon substrate covered with glass or a silicon-oxide film, is prepared.

A film of a conductive material, such as Al, Cr, W, Mo, AlNd, Ti, Ta, AlTi or the like, is formed on the insulating surface of the insulating substrate 1 by sputtering as the gate electrode 2 such that the thickness of the gate electrode 2 in the form of a single layer or a plurality of layers is 70 nm–500 nm.

Wet etching is used as etching. At that time, a sensor electrode 9 of the sensor unit 11 to be combined with the thin-film transistor 12 is also formed and patterned.

A silicon-oxide film or a silicon-nitride film is formed by CVD as the insulating film 3. The semiconductor layer 4 formed on the insulating film 3 is an i-layer made of non-doped hydrogenated amorphous silicon, and is consecutively formed after the insulating film 3 in a vacuum. The thickness of the insulating film 3 is 150–400 nm, and the thickness of the semiconductor layer 4 is 300 nm–1,500 nm. The insulating film 3 and the semiconductor layer 4 of the MIS-type sensor unit 11 to be combined with the thin-film transistor 12 are simultaneously formed (see FIG. 4A).

The thickness of the semiconductor layer 4 is made very large as described above, in order to improve light absorptance of the semiconductor layer 4 of the sensor unit 11.

In order to make portions of the i-layer to be below the source and drain electrodes 6 thinner, only portions S and D of the i-layer to be below the source and drain electrodes 6 are etched. At that time, a photoresist (not shown) is coated so as to cover a gap portion C between the source and the drain, and patterning of the photoresist is performed by an exposure apparatus so that the photoresist is removed from the portions S and D of the i-layer to be below the source and the drain electrodes 6.

After the patterning of the photoresist, portions of the surface of the i-layer where the photoresist are not present is etched by a dry-etching apparatus. Dry etching using an anode-coupling-type plasma etching apparatus, reactive etching or chemical dry etching may be used as the etching in the second embodiment. Control is performed so that the thickness t2 of the portions of the semiconductor layer 4 to be below the source and drain electrodes 6 becomes 50–300 nm, inclusive of a process margin, after the etching. The thickness t1 of the portion of the semiconductor layer 4 at the gap portion C is 300 nm–1,500 nm, which is the thickness at the first film formation. The thickness of the semiconductor layer 4 of the sensor unit 11 is also 300 nm–1,500 nm, which is the thickness t1 at the first film formation, because this semiconductor layer 4 is not etched without being coated with the photoresist, as the gap portion C (see FIG. 4B).

After removing the photoresist, metal particles on the surface are removed by processing the surface with a solution containing a chelating agent. An organic film adhering to the surface is simultaneously removed by removing metal particles contained within the organic film by the chelating agent. Instead of the solution containing the chelating agent, a mixed solution of ammonia and an aqueous solution of hydrogen peroxide, a mixed solution of hydrochloric acid and an aqueous solution of hydrogen peroxide, or the like may also be used as in the first embodiment. After the above-described processing, a natural oxide film on the surface is removed by performing surface treatment using an aqueous solution containing about 1 volume % of hydrofluoric acid and about 40 volume % of ammonium fluoride. At that time, acetic acid may be added to the aqueous solution containing hydrofluoric acid and ammonium fluoride. Alternatively, a solution containing hydrofluoric acid and water may be used as in the first embodiment, or acetic acid may also be added to this solution. Instead of the above-described processing using chemicals, plasma processing may be performed in an atmosphere containing at least oxygen.

As the insulating film 3 and the semiconductor layer 4, the doped semiconductor layer 5 is formed by CVD. During the film formation, phosphorus is doped by adding hydrogen-diluted phosphine to a silane gas. Before the film formation, hydrogen-plasma processing is performed at the same film forming pressure as at the film formation of the semiconductor layer 4, with electric power equal to or less than electric power during film formation of the semiconductor layer 4. It is more preferable to hydrogenate the surface by performing hydrogen plasma processing at the same film forming pressure as at the film formation of the semiconductor layer 4, with electric power less than (or equal to) electric power during film formation of the doped semiconductor layer 5, for about 5–15 minutes. Then, by performing processing by plasma containing phosphine for 30 minutes, a better ohmic contact at the interface is provided. The thickness of the doped semiconductor layer 5 is 20 nm–100 nm.

Since the doped semiconductor layer 5 is used not only as an ohmic contact layer of the source and drain electrodes 6 of the thin-film transistor but also as a transparent electrode of the MIS-type sensor unit 11, it is desirable to reduce the resistance of the doped semiconductor layer 5 by providing a large thickness. After forming the doped semiconductor layer 5, Al as a material for the source and drain electrodes 6 and wires is formed by sputtering. The thickness of the Al layer is, for example, about 1,000 nm (see FIG. 4C).

Figure 4A:
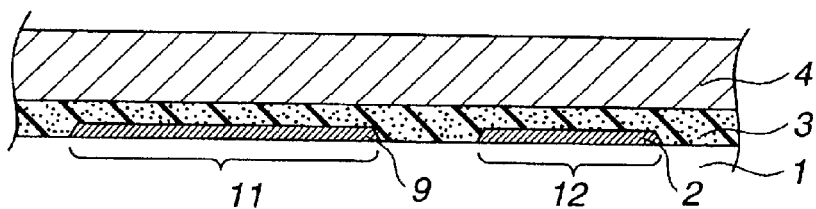
FIGS. 4A–4E are cross-sectional views illustrating a process for manufacturing the photoelectric transducer shown in FIG. 2.
Figure 4B:
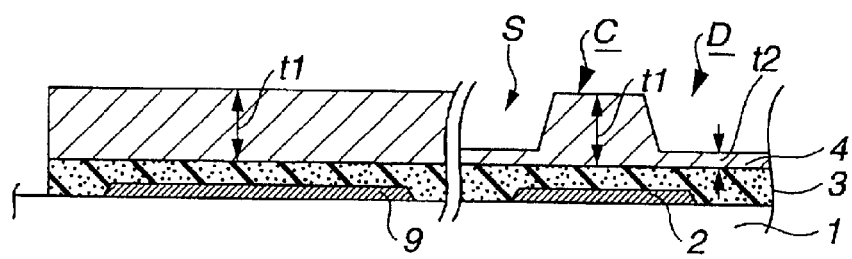
Figure 4C:
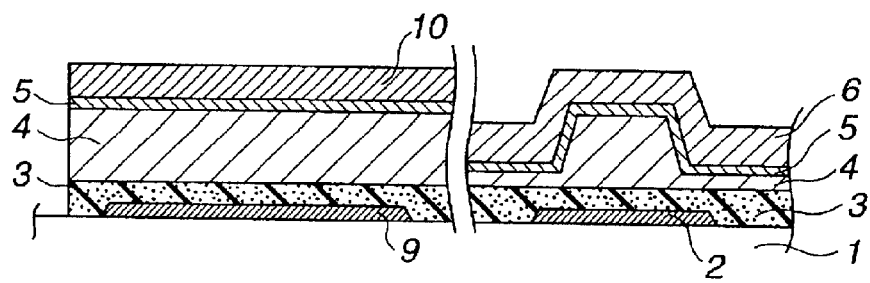
Figure 4D:
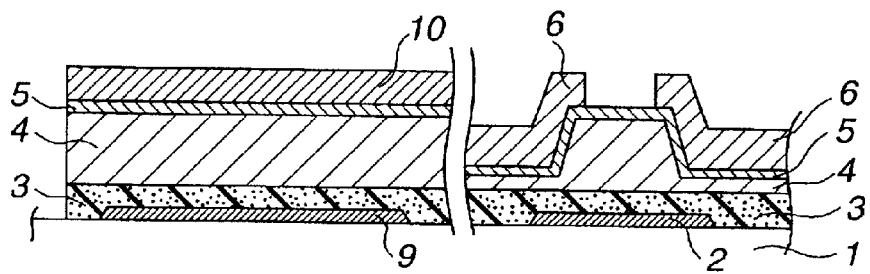
Figure 4E:
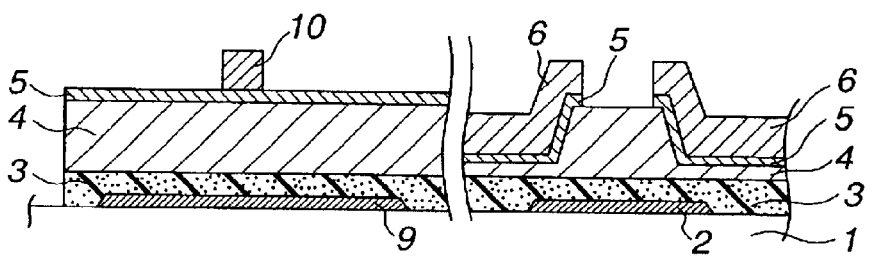

Patterning of the source and drain electrodes 6 and the wires is performed according to photolithography, and etching is performed according to wet etching (see FIG. 4D).

After forming the source and drain electrodes 6 and the wires, a portion of the doped semiconductor layer 5 at the gap portion between the source and drain electrodes 6 is removed by etching using the same photoresist.

Anode-coupling plasma etching or dry etching is suitable as the etching, because damage by plasma at etched portions is small. However, reactive etching may also be used. Then, a common-electrode wire 10 of the sensor unit 11 is patterned according to photolithography (see FIG. 4E).

Thus, it is possible to manufacture the thin-film transistor and the photoelectric transducer according to substantially the same process by only providing an additional mask for photolithography.

In a state in which the thin-film transistor has been formed, the protective film 7 shown in FIG. 2 is formed by CVD. A silicon nitride film may be used as the protective film 7. Although it depends on steps in the pattern of the formed thin-film transistor, the thickness of the protective film 7 may be within a range of about 500 nm–2,000 nm.

When manufacturing a radiation detector, as shown in FIG. 2, the phosphor layer 18 is formed on the protective film 7, so that, when a radiation (X-rays, an $\alpha$ ray, a $\beta$ ray, a $\gamma$ ray or the like) is projected, the phosphor layer 18 performs photo-conversion, and generated light is detected by the MIS-type sensor 11 provided below the phosphor layer 18. GOS (gadolinium oxysulphide phosphor screen) or cesium iodide may be used for the phosphor layer 18.

In the second embodiment, by making the thickness of the portions of the semiconductor layer 4 below the source and drain electrodes 6 to a smaller value of 50 nm–300 nm, it is possible to reduce a series resistance of the thin-film transistor due to a perpendicular component of the semiconductor layer 4, greatly reduce the on-resistance of the thin-film transistor, and improve the transfer efficiency of the thin-film transistor. At the same time, as for the gap portion between the source and the drain, by making the thickness of the semiconductor layer 4 to a larger value of 300 nm–1,500 nm, it is possible to prevent an increase in the off-current. As a result, it is possible to realize a thin-film transistor having an excellent transfer efficiency and characteristics.

It is also possible to prevent an increase in the off-current due to damage of the surface produced at gap etching. Furthermore, since the sensor unit is not thinned by etching and includes the semiconductor layer 4 whose thickness is equal to or slightly larger than the thickness of the gap portion between the source and the drain, light absorptance at the sensor unit 11 is secured. Hence, it is possible to realize a high-sensitivity MIS-type semiconductor sensor. In addition, by forming thin films constituting the MIS-type sensor unit 11 simultaneously with formation of films constituting the thin-film transistor 12, the manufacturing process can be greatly simplified.

In the second embodiment, the case of using the thin-film transistor for the photoelectric transducer has been mainly described. However, the thin-film transistor of the present invention may be suitably used for all semiconductor devices which use thin-film transistors, such as liquid-crystal display devices, organic EL displays and the like.

By using the thin-film transistors of the present invention for a liquid-crystal display device, it is possible to increase the response speed, and by manufacturing the thin-film transistors to a small size, it is possible to provide a light displayed image by increasing the numerical aperture of a cell. Furthermore, by using the thin-film transistors of the present invention for a photoelectric transducer, the driving speed can be increased, and by increasing the numerical aperture of a cell, the sensitivity of the sensor can be increased.

(Third Embodiment)

Figure 5:
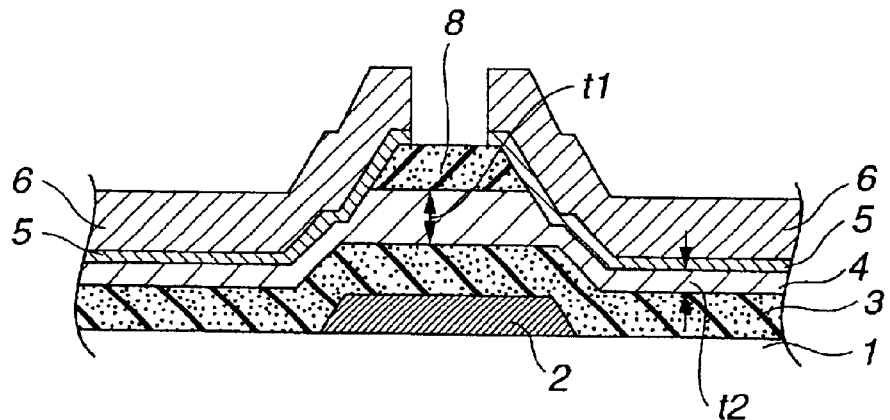
FIG. 5 is a cross-sectional view illustrating the configuration of a thin-film transistor according to a third embodiment of the present invention.

FIG. 5 is a cross-sectional view illustrating the configuration of a thin-film transistor according to a third embodiment of the present invention. In FIG. 5, reference numeral 1 represents an insulating substrate. A gate electrode 2, an insulating film 3, a semiconductor layer 4, a channel-protection film 8, a doped semiconductor layer 5, and source and drain electrodes 6 are formed on the insulating substrate 1.

Since the gate electrode 2, the insulating film 3 and the semiconductor layer 4 are formed on the insulating substrate 1, and after forming the channel protection film 8, the doped semiconductor layer 5, and the source and drain electrodes 6 are laminated in the above-described manner, a channel-stopper-type thin-film transistor, in which the surface of the above-described gap portion is covered with the channel protection film 8, and end portions of the channel protection film 8 are covered with the source and drain electrodes 6, is provided.

In the present invention, in such a channel-stopper-type thin-film transistor, the following effects can also be expected by making the thickness t2 of portions of the semiconductor layer 4 below the source and drain electrodes 6 smaller than the thickness t1 of a portion of the semiconductor layer 4 at the gap portion between the source and the drain.

That is, since the portion of the semiconductor layer 4 at the gap portion between the source and the drain is thicker, a good-quality semiconductor film can be used. Furthermore, since diffusion of a dopant from the doped semiconductor layer 5 into the gap portion is suppressed, it is possible to prevent a shift of the threshold voltage or an increase in the off-current. In addition, since the portions of the semiconductor layer 5 below the source and drain electrodes 6 is thinner, the resistance below the source and the drain is reduced and the on-resistance is also reduced.

A process for manufacturing the thin-film transistor shown in FIG. 5 will now be described with reference to FIGS. 6A–6C.

First, the insulating substrate 1 is prepared. The gate electrode 2 having a thickness of 70 nm–500 nm is formed on an insulating substrate of the insulating substrate 1.

Then, using a plasma CVD apparatus having cluster-type multiple chambers, the insulating film 3, the semiconductor film 4 and the channel-protection film 8 are consecutively formed in a vacuum in three reaction chambers or in a common chamber.

Figure 6A:
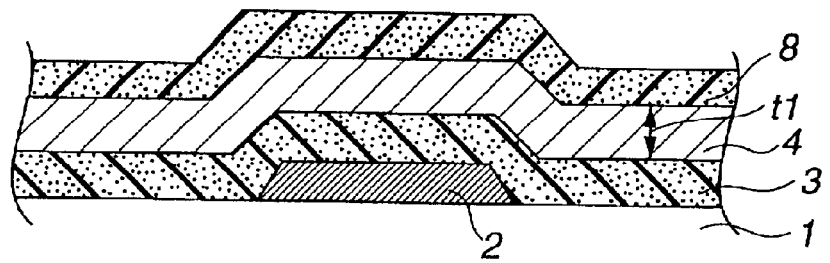
FIGS. 6A–6C are cross-sectional views illustrating a process for manufacturing the thin-film transistor shown in FIG. 5.

The thickness of the insulating film 3 at that time is 150 nm–400 nm, the thickness t1 of the semiconductor layer 4 is 60 nm–150 nm, and the thickness of the channel protection film 8 is 30 nm–300 nm (see FIG. 6A).

Then, the channel protection film 8 is patterned so that the channel protection film 8 remains on the portion of the semiconductor layer 4 at the gap portion. Then, in order to make the thickness of the portions of the semiconductor layer 4 to be below the source and drain electrodes 6 smaller than the thickness of the portion of the semiconductor layer 4 at the gap portion, source and drain portions S and D, respectively, of the semiconductor layer 4 are etched. More specifically, a photoresist (not shown) is coated on the channel protection film 8 above the gap portion C, and the photoresist is patterned by an exposure apparatus so that the photoresist is removed at the source and drain portions S and D, respectively. After patterning of the photoresist, portions of the channel protection film 8 and the semiconductor layer 4 that are not coated with the photoresist are etched by a dry-etching apparatus. Thus, the thickness t2 of the portions of the semiconductor layer 4 to be below the source and drain electrodes 6 are made about 30 nm–70 nm.

The portions of the semiconductor layer 4 to be below the source and the drain electrodes 6 may be entirely etched to make the thickness t2 zero, depending on the situation. On the other hand, the thickness of the portion of the semiconductor layer 4 at the gap portion remains 60 nm–150 nm, which is the thickness at initial film formation (see FIG. 6B).

After stripping the photoresist after the etching, surface treatment by a solution containing a chelating agent, or the like, or plasma processing in an atmosphere containing oxygen is performed. Then, a surface oxide film is removed by hydrofluoric acid.

Figure 6B:
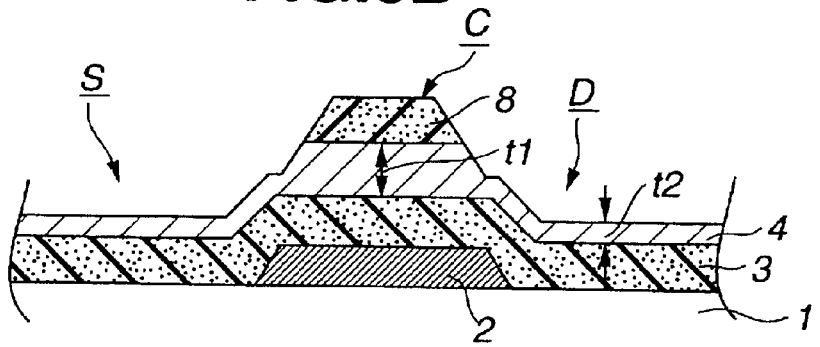
Figure 6C:
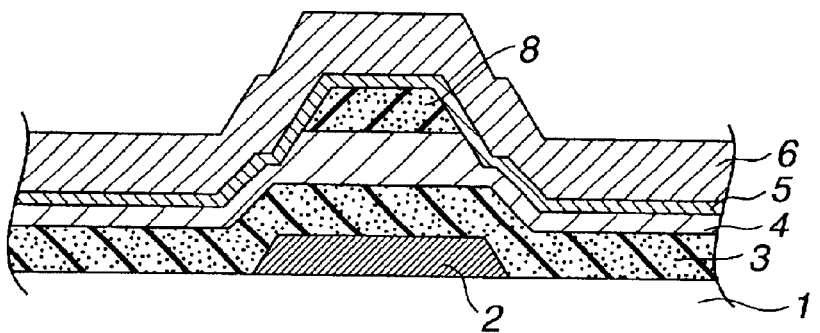

Then, after performing hydrogen-plasma processing on the structure shown in FIG. 6B if necessary, the doped semiconductor layer 5 having a thickness of 20 nm–70 nm is deposited so as to cover the channel protection film 8. Then, a conductor for the source and drain electrodes 6 is deposited (FIG. 6C).

Then, after patterning the source and drain electrodes 6, the doped semiconductor layer 5 is etched using the same photoresist as when forming the source and drain electrodes 6. At that time, since the channel protection film 8 serves as an etching stopping layer during the etching of the doped semiconductor layer 5, the semiconductor layer 4 at the gap portion C is not etched.

Thus, the thin-film transistor shown in FIG. 5 is obtained.

(Fourth Embodiment)

A process for manufacturing a semiconductor device according to a fourth embodiment of the present invention will now be described with reference to FIGS. 7A–7E.

First, an insulating substrate 1 is prepared. A gate electrode 2 having a thickness of 70 nm–500 nm is formed on an insulating substrate of the insulating substrate 1.

Then, using a plasma CVD apparatus having cluster-type multiple chambers, an insulating film 3, a semiconductor film 4 and a channel protection film 8 are consecutively formed in a vacuum.

Figure 7A:
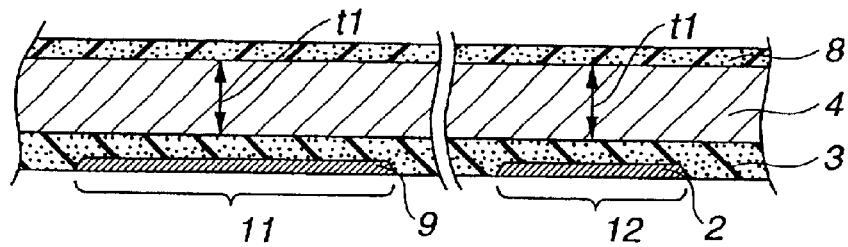
FIGS. 7A–7E are cross-sectional views illustrating a process for manufacturing a photoelectric transducer using a thin-film transistor according to a fourth embodiment of the present invention.
Figure 7B:
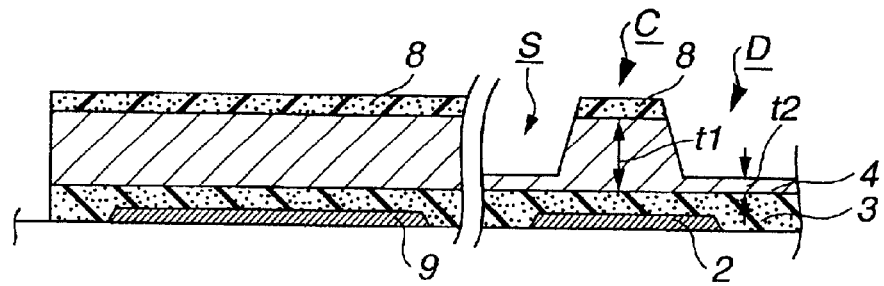

The thickness of the insulating film 3 at that time is 150 nm–400 nm, the thickness t1 of the semiconductor layer 4 is 300 nm–1,500 nm, and the thickness of the channel protection film 8 is 30 nm–300 nm (see FIG. 7A).

Then, a photoresist (not shown) is coated on the channel protection film 8 above a gap portion C and a sensor unit 11, and the photoresist is patterned by an exposure apparatus so that the photoresist is removed at source and drain portions S and D, respectively. After patterning of the photoresist, portions of the channel-protection film 8 and the semiconductor layer 4 that are not coated with the photoresist are sequentially etched by a dry-etching apparatus. Thus, the thickness t2 of the portions of the semiconductor layer 4 to be below source and drain electrodes 6 are made small to about 50 nm–300 nm. Then, by removing unnecessary portions of the channel protection film 8, the semiconductor layer 4 and the insulating layer 8, isolation between the thin-film transistor and the sensor unit 11 and formation of contact holes (not shown) are performed.

The semiconductor layer 4 at the source and drain portions S and D, respectively, may be entirely etched to make the thickness t2 zero, depending on the situation. On the other hand, the thickness t1 of the portion of the semiconductor layer 4 at the gap portion remains 300 nm–1,500 nm, which is the thickness at initial film formation (see FIG. 7B).

Figure 7C:
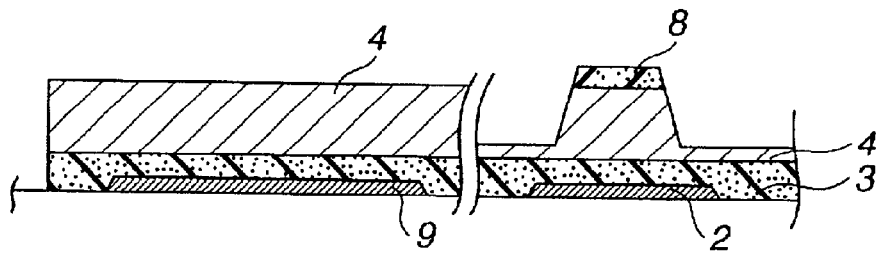
Figure 7D:
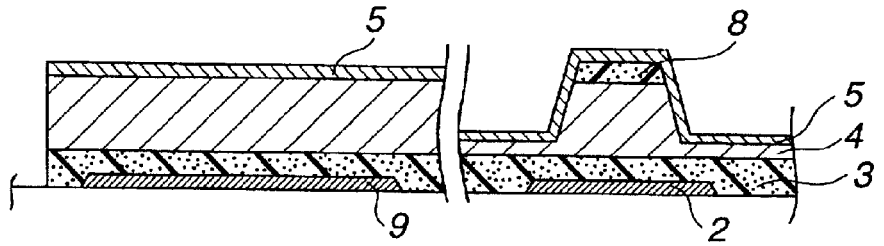
Figure 7E:
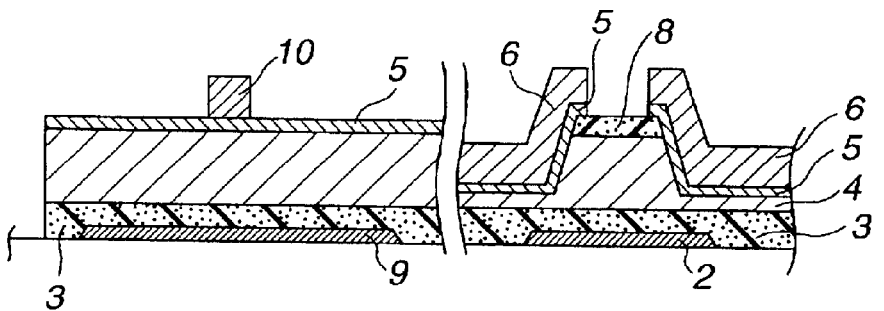

Then, the portion of the channel protection film 8 above the sensor unit 11 is removed (see FIG. 7C).

After stripping the photoresist, surface treatment by a solution containing a chelating agent, or the like, or plasma processing in an atmosphere containing oxygen is performed. Then, a surface oxide film is removed by hydrofluoric acid.

Then, after performing hydrogen-plasma processing on the structure shown in FIG. 7C if necessary, a doped semiconductor layer 5 having a thickness of 20 nm–100 nm is deposited so as to cover the channel protection film 8. Then, a conductor for the source and drain electrodes 6 is deposited.

Then, after patterning the source and drain electrodes 6, the doped semiconductor layer 5 is etched using the same photoresist as when forming the source and drain electrodes 6.

Then, by patterning the conductor on the sensor unit 11, a wire electrode 10 of the sensor unit 11 is formed. Thus, the thin-film transistor shown in FIG. 5 is obtained.

(Fifth Embodiment)

A process for manufacturing a semiconductor device according to a fifth embodiment of the present invention will now be described with reference to FIGS. 8A–8E.

First, an insulating substrate 1 is prepared. A gate electrode 2 having a thickness of 70 nm–500 nm is formed on an insulating substrate of the insulating substrate 1.

Then, using a plasma CVD apparatus having cluster-type multiple chambers, an insulating film 3, a semiconductor film 4 and a channel-protection film 8 are consecutively formed in a vacuum.

Figure 8A:
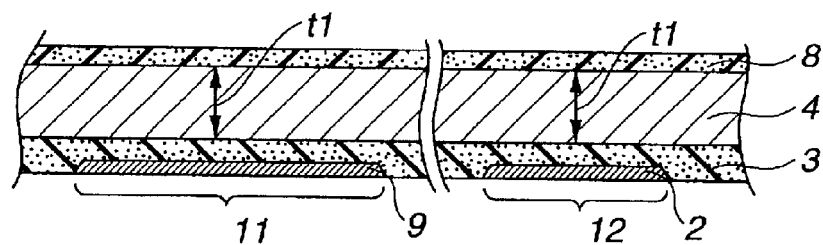
FIGS. 8A–8E are cross-sectional views illustrating a process for manufacturing a photoelectric transducer using a thin-film transistor according to a fifth embodiment of the present invention.
Figure 8B:
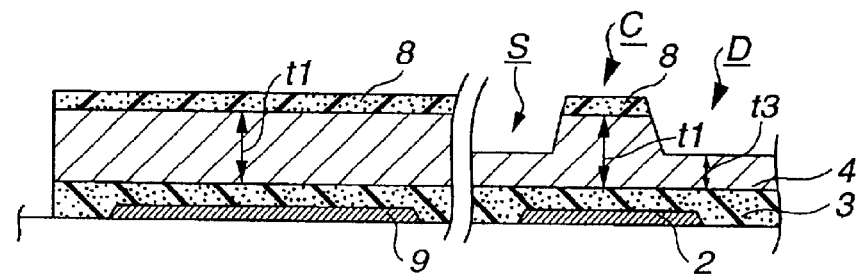

The thickness of the insulating film 3 at that time is 150 nm–400 nm, the thickness t1 of the semiconductor layer 4 is 300 nm–1,500 nm, and the thickness of the channel protection film 8 is 30 nm–300 nm (see FIG. 8A).

Then, after coating a positive photoresist (not shown), the photoresist on source and drain portions S and D, respectively, of a thin-film transistor 12 is completely exposed, and the photoresist on a sensor unit 11 is subjected to half exposure with an amount of light equal to or less than the amount of light for the source and drain portions S and D, respectively, using a halftone mask. By developing the photoresist, the photoresist is caused to remain on a gap portion C and the photoresist whose thickness is about half the thickness of the gap portion C is caused to remain on the sensor unit 11. Then, using a dry-etching apparatus, at least the channel protection film 8 is etched until the photoresist remains on the gap portion C but disappears on the sensor unit 11, and the semiconductor layer 4 below the channel protection film 8 is etched if necessary. Since at least the channel-protection film 8 is etched and the semiconductor layer 4 below the channel-protection film 8 is also etched if necessary, at the source and drain portions S and D, respectively, for example, the semiconductor layer 4 has thicknesses of t1–t3 (see FIG. 8B).

Then, the channel-protection film 8 is etched until at least the channel-protection film 8 above the sensor unit 11 disappears, and the semiconductor layer 4 at the source and drain portions S and D, respectively, is also etched such that the thickness t2 becomes about 50 nm–300 nm.

Then, by removing unnecessary portions of the channel protection film 8, the semiconductor layer 4 and the insulating layer 8, isolation between the thin-film transistor and the sensor unit 11 and formation of contact holes (not shown) are performed.

The portions of the semiconductor layer 4 to be below source and drain electrodes may be entirely etched to make the thickness t2 zero, depending on the situation. On the other hand, the thickness t1 of the portion of the semiconductor layer 4 at the gap portion is the thickness at initial film formation.

After stripping the photoresist, surface treatment by a solution containing a chelating agent, or the like, or plasma processing in an atmosphere containing oxygen is performed. Then, a surface oxide film is removed by hydrofluoric acid.

Figure 8C:
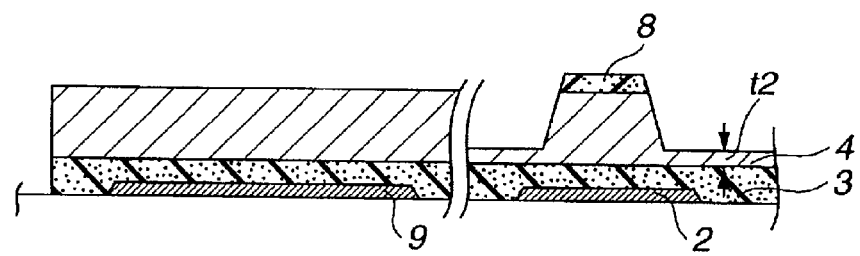
Figure 8D:
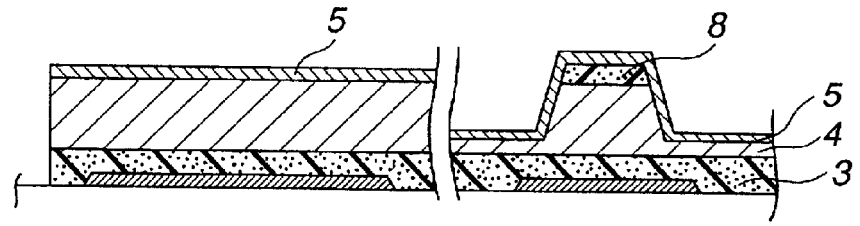

Then, after performing hydrogen-plasma processing on the structure shown in FIG. 8C if necessary, a doped semiconductor layer 5 having a thickness of 20 nm–100 nm is deposited so as to cover the channel protection film 8 at the gap portion. Then, a conductor for the source and drain electrodes 6 is deposited.

Then, after patterning the source and drain electrodes 6, the doped semiconductor layer 5 is etched using the same photoresist as when forming the source and drain electrodes 6.

Figure 8E:
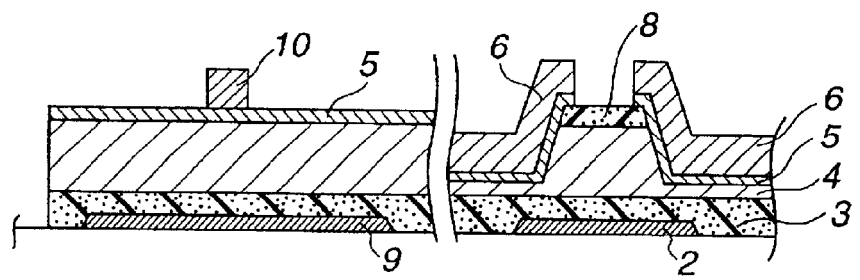
Figure 9:
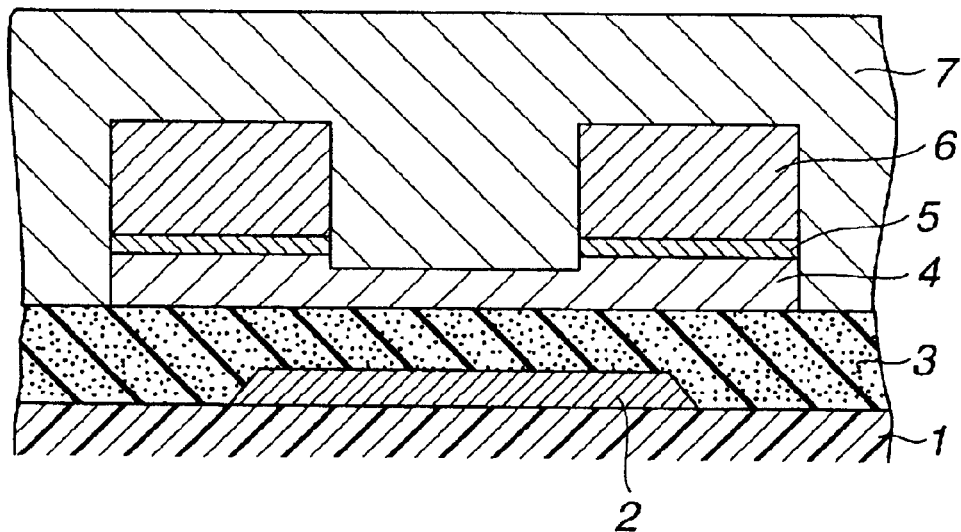
FIG. 9 is a cross-sectional view illustrating the configuration of a conventional gap-etching-type thin-film transistor.
Figure 10:
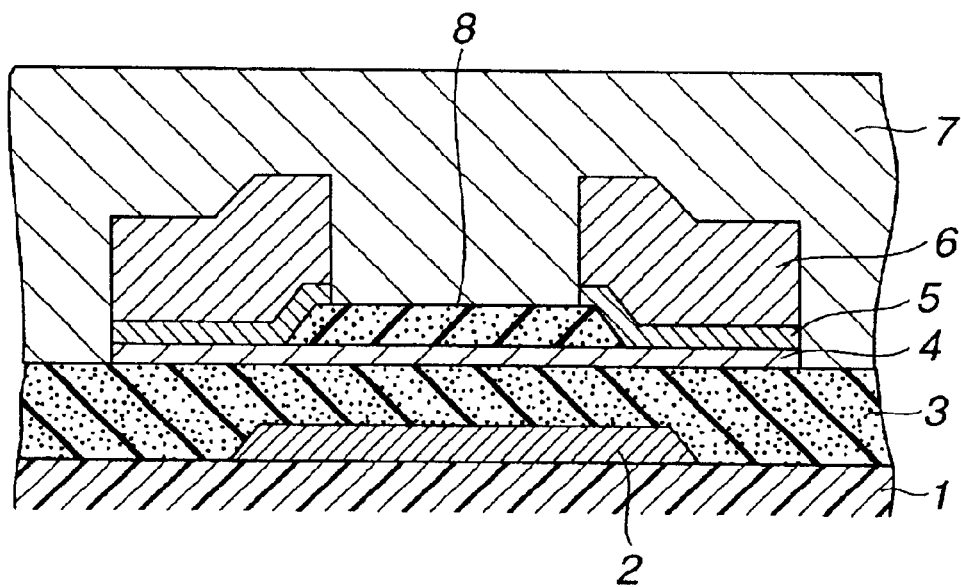
FIG. 10 is a cross-sectional view illustrating the configuration of a conventional etching-stopper-type thin-film transistor.

Then, by patterning the conductor on the sensor unit 11, a wire electrode 10 of the sensor unit is formed. Thus, the thin-film transistor shown in FIG. 8E is obtained.

In a state in which the thin-film transistor of any one of the third through fifth embodiments has been formed, the protective film 7 shown in FIG. 2 is formed according to CVD. A silicon nitride film may be used as the protective film 7. Although it depends on steps in the pattern of the formed thin-film transistor, the thickness of the protective film 7 may be within a range of about 200 nm–2,000 nm.

When manufacturing a radiation detector according to any one of the third through fifth embodiments, as shown in FIG. 2, the phosphor layer 18 may be formed on the protective film 7, so that, when a radiation is projected, the phosphor layer 18 performs photo-conversion, and generated light is detected by the MIS-type sensor 11 provided below the phosphor layer 18.

In the above-described embodiments, by making the thickness of the portions of the semiconductor layer 4 below the source and drain electrodes 6 smaller, it is possible to reduce a series resistance of the thin-film transistor due to a perpendicular component of the semiconductor layer 4, greatly reduce the on-resistance of the thin-film transistor, and improve the transfer efficiency of the thin-film transistor.

At the same time, as for the gap portion, by making the thickness of the semiconductor layer 4 to a larger value of, for example, at least 60 nm, it is possible to prevent problems due to degradation of the film quality. As a result, it is possible to realize a thin-film transistor having an excellent transfer efficiency and characteristics.

Since the portion of the semiconductor layer at the gap portion is not etched, an increase in the off-current due to damage of the surface produced at gap etching does not occur. Furthermore, since the sensor unit is not thinned by etching and includes the semiconductor layer 4 whose thickness is equal to or slightly less than the thickness of the gap portion between the source and the drain, light absorptance at the sensor unit is secured. Hence, it is possible to realize a high-sensitivity MIS-type semiconductor sensor. In addition, by forming thin films constituting the MIS-type sensor unit 11 simultaneously with formation of films constituting the thin-film transistor, the manufacturing process can be greatly simplified.

In each of the fourth and fifth embodiments, the case of using the thin-film transistor for the photoelectric transducer has been mainly described. However, the thin-film transistor of the present invention may be suitably used for all semiconductor devices which use thin-film transistors, such as liquid-crystal display devices, organic EL displays and the like.

By using the thin-film transistors of the present invention for a liquid-crystal display device, it is possible to increase the response speed, and by manufacturing the thin-film transistors to a small size, it is possible to provide a light displayed image by increasing the numerical aperture of a cell. Furthermore, by using the thin-film transistors of the present invention for a photoelectric transducer, the driving speed can be increased, and by increasing the numerical aperture of a cell, the sensitivity of the sensor can be increased.

The individual components shown in outline or designated by blocks in the drawings are all well known in the semiconductor device arts and their specific construction and operation are not critical to the operation or the best mode for carrying out the invention.

While the present invention has been described with respect to what are presently considered to be the preferred embodiments, it is to be understood that the invention is not limited to the disclosed embodiments. To the contrary, the present inventions is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A semiconductor device including a bottom-gate-type thin-film transistor comprising:
    a gate electrode provided on an insulating surface of a substrate;
    a semiconductor layer provided on said gate electrode via a gate insulating layer;
    a pair of doped semiconductor layers adjacent to the semiconductor layer; and
    source and drain electrodes comprising a pair of conductors adjacent to corresponding ones of said pair of doped semiconductor layers, with a gap formed between said source and drain electrodes,
    wherein a first portion of the semiconductor layer disposed below said source electrode and a second portion of the semiconductor layer disposed below said drain electrode each has a thickness smaller than a thickness of a third portion of the semiconductor layer disposed below the gap,
    wherein each of said source and drain electrodes has a portion overlapping said gate electrode,
    wherein a portion of one of said doped semiconductor layers is formed on a first area of the semiconductor layer, said first area being adjacent to said third portion, and said first area having a thickness greater than said thickness of said first portion and said thickness of said second portion, and
    wherein a portion of the other one of said doped semiconductor layers is formed on a second area of the semiconductor layer, said second area being adjacent to said third portion, and said second area having a thickness greater than said thickness of said first portion and said thickness of said second portion.

2. A semiconductor device according to claim 1, wherein said thickness of said first portion and said thickness of said second portion are within a range of 30 nm–300 um, and wherein the thickness of said third portion is within a range of 60 nm–1,500 nm.

3. A semiconductor device according to claim 1, wherein a protective film covers said source and drain electrodes and a surface of said third portion.

4. A semiconductor device according to claim 1, wherein a surface of said third portion is covered with a channel-protection film, and end portions of the channel-protection film are covered with said source and drain electrodes.

5. A semiconductor device according to any one of claims 1, 2, 3 or 4, wherein said first and second portions have been thinned by etching.

6. A semiconductor device according to claim 1, further comprising photoelectric transducers provided on the insulating surface of the substrate.

7. A semiconductor device according to claim 6, wherein each of said photoelectric transducers comprises a semiconductor layer made of a material which is the same as a material making up said third portion and whose thickness is the same as said thickness of said third portion.

8. A semiconductor device according to claim 6, wherein each of said photoelectric transducers comprises a semiconductor layer made of a material which is the same as a material making up said third portion and whose thickness is the same as said thickness of said third portion, a doped semiconductor layer made of a material which is the same as a material making up said doped semiconductor layers and whose thickness is the same as a thickness of said doped semiconductor layers, and an insulating layer made of a material which is the same as a material making up said gate insulating layer and whose thickness is the same as a thickness of said gate insulating layer.

9. A semiconductor device according to claim 6, wherein said semiconductor device comprises pixels and a plurality of said thin-film transistor, wherein said pixels are arranged two-dimensionally, with each of said pixels comprising (i) one of said plurality of said thin-film transistor and (ii) a photoelectric transducer of said photoelectric transducers, and wherein a layer for converting a radiation into light is provided at a light-incident side of said photoelectric transducers.

10. A radiation detector comprising:
    said semiconductor device according to claim 9; and
    a controller for processing an image signal from said semiconductor device and transmitting the image signal to an external apparatus.

11. A radiation detector according to claim 10, further comprising a display device for displaying an image.

12. A method for manufacturing a semiconductor device including a bottom-gate-type thin-film transistor which includes a gate electrode provided on an insulating surface of a substrate, a semiconductor layer provided on the gate electrode via a gate insulating layer, a pair of doped semiconductor layers adjacent to the semiconductor layer, and source and drain electrodes comprising a pair of conductors adjacent to corresponding ones of said pair of doped semiconductor layers, with a gap formed between said source and drain electrodes, said method comprising the steps of:
    forming the semiconductor layer;
    removing a surface of a first portion of the semiconductor layer where said source electrode is to be formed and removing a surface of a second portion of the semiconductor layer where said drain electrode is to be formed, by etching, in a state in which a surface of a third portion of the semiconductor layer which is to be disposed beneath the gap is covered with an etching mask, so that a thickness of said first portion and a thickness of said second portion are made smaller than a thickness of said third portion;

forming said doped semiconductor layers on said first and second portions such that (i) a portion of one of said doped semiconductor layers is formed on a first area of the semiconductor layer, said first area being adjacent to said third portion, and said first area having a thickness greater than said thickness of said first portion and said thickness of the second portion, and (ii) a portion of the other one of said doped semiconductor layers is formed on a second area of the semiconductor layer, said second area being adjacent to said third portion, and said second area having a thickness greater than said thickness of said first portion and said thickness of said second portion; and forming the source and drain electrodes on said doped semiconductor layers, with each of said source and drain electrodes having a portion overlapping said gate electrode.

13. A method according to claim 12, wherein after removing the etching mask, at least one surface treatment selected from surface treatment by a solution containing ammonia or hydrogen chloride, and hydrogen peroxide, surface treatment by a solution containing a chelating agent, and surface treatment utilizing oxygen plasma is performed for said first and second portions.

14. A method according to claim 12, wherein after removing the etching mask, surface treatment for removing an organic substance is performed for said first and second portions, and then surface treatment by a solution containing hydrogen fluoride is performed.

15. A method according to claim 12, wherein after removing the etching mask, surface treatment utilizing hydrogen plasma is performed in an apparatus for forming said doped semiconductor layers.

16. A method according to claim 15, wherein discharge electric power of the plasma during the surface treatment utilizing the hydrogen plasma is equal to or less than discharge electric power when forming the semiconductor layer.

17. A method according to claim 15, wherein discharge electric power during the surface treatment utilizing the hydrogen plasma is equal to or less than discharge electric power when forming said doped semiconductor layers.

18. A method according to claim 12, wherein a channel-protection film is formed on the semiconductor layer before said removing step.

19. A method according to claim 12, wherein photoelectric transducers are formed on the insulating surface of the substrate, and wherein a semiconductor layer of each of said photoelectric transducers is made of a material which is the same as a material making up said third portion and whose thickness is the same as said thickness of said third portion.

20. A method according to claim 19, wherein surfaces of said first and second portions are etched in a state in which a surface of the semiconductor layer of each of said photoelectric transducers and a surface of the semiconductor layer of the thin-film transistor are covered with a protective film, wherein the protective film covering the surface of the semiconductor layer of each of said photoelectric transducers is etched, and wherein the surfaces of said first and second portions are etched to a point which is deeper than a point to which the protective film covering the surface of the semiconductor layer of each of said photoelectric transducers is etched.

21. A flat sensor comprising:

a bottom-gate-type thin film transistor which includes a gate electrode provided on an insulating surface of a substrate, a semiconductor layer provided on said gate electrode via a gate insulating layer, a pair of doped semiconductor layers adjacent to the semiconductor layer, and source and drain electrodes comprising a pair of conductors adjacent to corresponding ones of said pair of doped semiconductor layers, with a gap formed between said source said drain electrodes; and an MIS type transistor, wherein a first portion of the semiconductor layer disposed below said source electrode and a second portion of the semiconductor layer disposed below said drain electrode each has a thickness smaller than a thickness of a third portion of the semiconductor layer disposed below the gap, wherein a portion of one of said doped semiconductor layers is formed on a first area of the semiconductor layer, said first area being adjacent to said third portion, and said first area having a thickness greater than said thickness of said first portion and said thickness of said second portion, and wherein a portion of the other one of said doped semiconductor layers is formed on a second area of the semiconductor layer, said second area being adjacent to said third portion, and said second area having a thickness greater than said thickness of said first portion and said thickness of said second portion.

22. A radiation detector comprising:

the flat panel sensor according to claim 21; and a controller for processing an image signal from said flat panel sensor and transmitting the image signal to an external apparatus.

* * * * *

UNITED STATES PATENT AND TRADEMARK OFFICE
CERTIFICATE OF CORRECTION

PATENT NO. : 6,794,682 B2 Page 1 of 1
DATED : September 21, 2004
INVENTOR(S) : Minoru Watanabe et al.

It is certified that error appears in the above-identified patent and that said Letters Patent is hereby corrected as shown below:

Column 1,
Line 29, "intension" should read -- intention --.
Line 61, "a etching-stopper" should read -- an etching-stopper --.

Column 17,
Line 27, "inventions" should read -- invention --.

Column 18,
Line 1, "30 nm-300 um," should read -- 30 nm -300 nm, --.

Column 20,
Line 15, "flat sensor" should read -- flat panel sensor --.
Line 24, "source said" should read -- source and --.

Signed and Sealed this

Twenty-sixth Day of April, 2005

JON W. DUDAS
*Director of the United States Patent and Trademark Office*